US009922808B2

(12) United States Patent
Rozak et al.

(10) Patent No.: US 9,922,808 B2
(45) Date of Patent: Mar. 20, 2018

(54) MULTI-BLOCK SPUTTERING TARGET AND ASSOCIATED METHODS AND ARTICLES

(71) Applicant: H.C. Starck, Inc., Newton, MA (US)

(72) Inventors: Gary Alan Rozak, Akron, OH (US); Mark E. Gaydos, Nashua, NH (US)

(73) Assignee: H.C. STARCK INC., Newton, MA (US)

( * ) Notice: Subject to any disclaimer, the term of this patent is extended or adjusted under 35 U.S.C. 154(b) by 0 days.

(21) Appl. No.: 15/067,358

(22) Filed: Mar. 11, 2016

(65) Prior Publication Data

US 2016/0196961 A1    Jul. 7, 2016

Related U.S. Application Data

(62) Division of application No. 13/467,323, filed on May 9, 2012, now Pat. No. 9,334,562.

(Continued)

(51) Int. Cl.
*C23C 14/34* (2006.01)
*H01J 37/34* (2006.01)
(Continued)

(52) U.S. Cl.
CPC ........ *H01J 37/3429* (2013.01); *B22F 1/0003* (2013.01); *B22F 3/15* (2013.01);
(Continued)

(58) Field of Classification Search
CPC .. B22F 1/0003; B22F 3/15; B22F 3/24; B22F 2003/153; B22F 2003/247; B22F 2301/20;
(Continued)

(56) References Cited

U.S. PATENT DOCUMENTS

| 3,714,702 A | 2/1973 | Hammond |
| 4,208,257 A | 6/1980 | Hom-ma et al. |

(Continued)

FOREIGN PATENT DOCUMENTS

| CN | 1370853 A1 | 9/2002 |
| CN | 1660526 A | 8/2005 |

(Continued)

OTHER PUBLICATIONS

Office Action from the US Patent Office for copending U.S. Appl. No. 13/793,043, dated Oct. 13, 2015.

(Continued)

*Primary Examiner* — Rodney McDonald
(74) *Attorney, Agent, or Firm* — Morgan, Lewis & Bockius LLP

(57) ABSTRACT

A sputtering target that includes at least two consolidated blocks, each block including an alloy including molybdenum in an amount greater than about 30 percent by weight and at least one additional alloying ingredient; and a joint between the at least two consolidated blocks, the joint being free of any microstructure due to an added bonding agent (e.g., powder, foil or otherwise), and being essentially free of any visible joint line the target that is greater than about 200 μm width (e.g., less than about 50 μm width). A process for making the target includes hot isostatically pressing, below a temperature of 1080° C., consolidated perform blocks that may be surface prepared (e.g., roughened to a predetermined roughness value) prior to pressing.

10 Claims, 4 Drawing Sheets

US 9,922,808 B2

Page 2

Related U.S. Application Data

(60) Provisional application No. 61/484,450, filed on May 10, 2011.

(51) Int. Cl.
*B22F 1/00* (2006.01)
*B22F 3/15* (2006.01)
*B22F 3/24* (2006.01)
*C22C 27/04* (2006.01)

(52) U.S. Cl.
CPC ............... *B22F 3/24* (2013.01); *C22C 27/04* (2013.01); *C23C 14/3407* (2013.01); *C23C 14/3414* (2013.01); *H01J 37/3491* (2013.01); *B22F 2003/153* (2013.01); *B22F 2003/247* (2013.01); *B22F 2301/20* (2013.01); *B22F 2998/10* (2013.01)

(58) Field of Classification Search
CPC . B22F 2998/10; C22C 27/04; C23C 14/3407; C23C 14/3414; H01J 37/3429; H01J 37/3491
USPC ........................................ 204/298.12, 298.13
See application file for complete search history.

(56) References Cited

U.S. PATENT DOCUMENTS

| | | | |
|---|---|---|---|
| 4,647,426 A | 3/1987 | Fiorentino |
| 4,747,907 A | 5/1988 | Acocella et al. |
| 4,820,393 A | 4/1989 | Brat et al. |
| 4,938,798 A | 7/1990 | Chiba et al. |
| 5,397,050 A | 3/1995 | Mueller |
| 5,429,877 A | 7/1995 | Eylon |
| 5,435,965 A | 7/1995 | Mashima et al. |
| 5,733,427 A | 3/1998 | Satou et al. |
| 5,857,611 A | 1/1999 | Gilman et al. |
| 5,895,663 A | 4/1999 | Irwin et al. |
| 5,896,553 A | 4/1999 | Lo |
| 5,963,778 A | 10/1999 | Stellrecht |
| 6,010,583 A | 1/2000 | Annavarapu et al. |
| 6,042,777 A | 3/2000 | Lo et al. |
| 6,071,389 A | 6/2000 | Zhang |
| 6,159,625 A | 12/2000 | Ueno |
| 6,165,413 A | 12/2000 | Lo et al. |
| 6,183,686 B1 | 2/2001 | Bardus et al. |
| 6,199,747 B1 | 3/2001 | Cohn et al. |
| 6,328,927 B1 | 12/2001 | Lo et al. |
| 6,419,806 B1 | 7/2002 | Holcomb et al. |
| 6,521,108 B1 | 2/2003 | Zhang |
| 6,619,537 B1 | 9/2003 | Zhang et al. |
| 6,638,381 B2 | 10/2003 | Keener et al. |
| 6,726,787 B2 | 4/2004 | Chern Lin et al. |
| 2003/0052000 A1 | 3/2003 | Segal et al. |
| 2004/0009087 A1 | 1/2004 | Yi et al. |
| 2004/0108028 A1 | 6/2004 | Guo et al. |
| 2004/0263055 A1 | 12/2004 | Chao et al. |
| 2005/0122443 A1 | 6/2005 | Kim et al. |
| 2005/0279630 A1 | 12/2005 | Fonte |
| 2006/0042728 A1 | 3/2006 | Lemon et al. |
| 2007/0251820 A1* | 11/2007 | Nitta ................... C23C 14/3407 204/298.13 |
| 2008/0314737 A1 | 12/2008 | Gaydos et al. |
| 2010/0086800 A1 | 4/2010 | Miller et al. |
| 2011/0097236 A1 | 4/2011 | Gaydos et al. |
| 2011/0117375 A1 | 5/2011 | Rozak et al. |
| 2011/0303535 A1 | 12/2011 | Miller et al. |
| 2012/0003486 A1 | 1/2012 | Rozak et al. |
| 2013/0224422 A1 | 8/2013 | Rozak et al. |
| 2013/0299347 A1 | 11/2013 | Rozak et al. |

FOREIGN PATENT DOCUMENTS

| | | |
|---|---|---|
| CN | 1676661 A | 10/2005 |
| CN | 101063194 A | 10/2007 |
| CN | 101360576 A | 2/2009 |
| EP | 285130 A1 | 10/1988 |
| EP | 590904 A1 | 4/1994 |
| EP | 902102 A1 | 3/1999 |
| JP | 06-177085 | 6/1994 |
| JP | 06-264233 | 9/1994 |
| JP | 11-074218 | 3/1999 |
| JP | 11-246967 | 9/1999 |
| JP | 2000-239838 A | 9/2000 |
| JP | 2002-327264 | 11/2002 |
| JP | 2003-129232 A | 5/2003 |
| JP | 2003-342720 A | 12/2003 |
| JP | 2004-035919 * | 2/2004 |
| JP | 2004-217990 | 5/2004 |
| JP | 2004-204253 A | 7/2004 |
| JP | 2005-097697 | 4/2005 |
| JP | 2005-307226 | 4/2005 |
| JP | 2006-114307 | 4/2006 |
| JP | 2007-297654 A | 11/2007 |
| JP | 2003-226966 A1 | 8/2013 |
| KR | 10-2007-0106402 A | 11/2007 |
| WO | 2004/090194 | 10/2004 |
| WO | 2012/154817 A1 | 11/2012 |
| WO | 2013/049274 A1 | 4/2013 |

OTHER PUBLICATIONS

Office Action from the Chinese Intellectual Property Office for copending patent application No. CN 201380024344, dated Dec. 3, 2015 with Translation of first two pages.
Office Action from the Korean Intellectual Property Office for copending patent application KR 10-2013-702787, dated Mar. 4, 2015.
Office Action from the Korean Intellectual Property Office for copending patent application No. 10-2014-7034399, dated Mar. 3, 2015.
Office Action from the China State Intellectual Property Office for copending patent application CN 201280022837.5, dated Nov. 15, 2014.
Office Action from the Japan Patent Office for copending patent application JP 2014510430, dated Nov. 13, 2014.
Matthew J. Donachie, Jr., "Titanium: A Technical Guide", ASM International, Dec. 2000, pp. 13-15.
H.C. Starck "Pure Molybdenum MMP Powder (99.95%)", Apr. 24, 2008.
M. Gerald, Atlantic Equipment Engineers, "Certificate of Analysis: Titanium Metal Powder Ti-106".
Primig,Sophie and Christian Mitterer, "Survey Report: Quantitative Analysis of MoTi Sputtering Targets", Feb. 7, 2012.
Contribute to the Development of Light Metal through Encouragement and Promotion of Reseach Study Education, Published in Surface and Coating Technology, vol. 169-170, pp. 151-154, (month unavailable) 2003, H. Habazaki et al., "Formation of Barrier-type Amorphous Anodic Films on Ti—Mo Alloys," pp. 1-3.
Procedings International Conference on Shape Memory and Superelastic Technologies (SMST-2003), M.H. Wu et al., Psuedoelastic Beta Ti—Mo—V—Nb—Al Alloys.
International Search Report dated Mar. 7, 2011 from the European Patent Office for copending application PCT/US2010/040756 filed on Jul. 1, 2010.
International Search Report, PCT/US2010/040772, dated Aug. 5, 2010.
International Search Report Issued in International Patent Application No. PCT/US2006/040214, dated Jun. 29, 2007.
Copending U.S. Appl. No. 13/856,617, filed Apr. 4, 2013, entitled, 'Molybdenum containing Targets Comprising Three Metal Elements,' Applicant Rozak, et al.
Copending U.S. Appl. No. 13/857,508, filed Apr. 5, 2013, entitled, 'Molybdenum Containing Targets,' Applicant Rozak, et al. (published as US2013/0224422A1).
Copending U.S. Appl. No. 13/793,043, filed Mar. 11, 2013, entitled. Multi-Blocksputtering Target with Interface Portions and Associated Methods and Articles. Applicant Rozak, et al (published as US 2013/0299347).

(56) References Cited

OTHER PUBLICATIONS

Copending U.S. Appl. No. 12/090,919, filed Jul. 11, 2008, entitled, "Methods of Making Molybdenum", Applicant Gaydos, et al. (Publication: US2008/0314737 A1 on Dec. 25, 2008).
Copending U.S. Appl. No. 12/917,668, filed Nov. 2, 2010, entitled, "Methods of Making Molybdenum", Applicant Gaydos, et al. (Publication: US2011/0097236 on Apr. 28, 2011).
Non-Final Office Action from the US Patent Office for U.S. Appl. No. 11/255,018 dated May 1, 2007.
Final Office Action from the US Patent Office for U.S. Appl. No. 11/255,018 dated Sep. 27, 2007.
Non-Final Office Action from the US Patent Office for U.S. Appl. No. 11/255,018 dated Apr. 24, 2008.
Final Office Action from the US Patent Office for U.S. Appl. No. 11/255,018 dated Nov. 24, 2008.
Non-Final Office Action from the US Patent Office for U.S. Appl. No. 11/255,018 dated Aug. 25, 2009.
Final Office Action from the US Patent Office for U.S. Appl. No. 11/255,018 dated May 6, 2010.
Final Office Action from the US Patent Office for U.S. Appl. No. 12/090,919 dated Dec. 6, 2011.
Chinese Office Action dated Jan. 22, 2010 (in Chinese).
Chinese Office Action dated Jan. 22, 2010 tranlated by Chinese Agent, Shanghai Patent & Trademark Law Office, LLC on Feb. 25, 2010.
European Search Report dated Feb. 25, 2011, for European Patent Application No. 10194969.1-2122.
Opposition filed with the European Patent Office by Heraeus Materials Technology GmbH & Co. KG—filed Feb. 7, 2012 for European Patent Application No. 10194969.1-2122.
Opposition filed with the European Patent Office by Plansee SE—filed Feb. 10, 2012 for European Patent Application No. 10194969.1-2122.
Office Action from the Japan Patent Office for Application 2008-536705 dated Jun. 7, 2012. (with translation of reasons for refusal).
Office Action from the Taiwan Patent Office for Application No. 95138492 dated Mar. 1, 2013. (with translation).
Office Action from the Taiwan Patent Office for Application No. 95138492 dated Sep. 28, 2012. (with translation).
Office Action for Korean Patent Application No. 10-2008-7012051 dated Apr. 8, 2013. Translation received Apr. 19, 2013.
International Preliminary report on patentability dated Jan. 17, 2013: Application No. PCT/US2010/040772.
International Preliminary report on patentability dated Jan. 17, 2013: Application No. PCT/2010/040756.
International Search Report, PCT/US2013/030316 dated Oct. 4, 2013.
Office Action from EP Patent Office for EP Application No. 10 730 323.3-1362, dated Oct. 14, 2013.
Non-Final Office Action from US Patent Office for U.S. Appl. No. 12/090,919, dated Jun. 22, 2011.
Non-Final Office Action from the US Patent Office for U.S. Appl. No. 12/090,919 dated Dec. 4, 2013.
Office Action for Japan Patent Application No. 2013-518356 dated Jan. 29, 2014.
Japan Office Action Application No. 2015-171446, dated Sep. 5, 2016.
Korea Notice of Decision of Final Rejection, Application No. 10-2016-7002856, dated Nov. 1, 2016.

\* cited by examiner

Powder Joint Line
(Standard Powder)

Powder Joint Line
(Standard Powder)

← Powderless Joint

— Molybdenum

← Powderless Joint

— Titanium

← Powderless Joint

← Titanium
← Powderless Joint
↙ Molybdenum

MULTI-BLOCK SPUTTERING TARGET AND ASSOCIATED METHODS AND ARTICLES

CLAIM OF BENEFIT OF FILING DATE

The present application claims the benefit of the filing date of U.S. Provisional Application Ser. No. 61/484,450 filed on May 10, 2011, of which is incorporated by reference herein for all purposes.

FIELD OF THE INVENTION

The present invention relates generally to sputtering, and more particularly to improved multi-component sputtering targets and their manufacture and use to produce thin films.

BACKGROUND OF THE INVENTION

Sputtering processes are employed to deposit thin films onto substrates to manufacture any of a variety of devices. Sputtering processes typically involve bombarding a solid sputtering target with energized particles to eject atoms from the target. In recent years, there has been a growing need for large area sputtering targets. This is especially so for certain applications in which large sized products are made. For example, flat panel displays often require the deposition of uniform thin films onto a substrate. The demand for larger displays, such as for televisions, continues to strain materials producers to develop alternative approaches to the efficient supply of such materials.

In one specific application, according to U.S. Pat. No. 7,336,324 (Kim et al), the deposition of a molybdenum-titanium barrier layer onto a substrate has been employed for the manufacture of a liquid crystal display device. Such application intensifies the need for large display devices capable of delivering such materials, particularly targets that contain both molybdenum and titanium.

In the manufacture of large area sputtering targets it is often deemed critical and imperative that the target exhibit uniformity in composition, microstructure, or a combination of both. For some device manufacturers that rely upon the targets to manufacture devices, the slightest imperfections are perceived as a potential quality control risk. By way of example, one concern for manufacturers is the potential formation of particles (e.g., atomic clusters or aggregates having an atomic composition different than the atomic composition of other regions of the film) during device manufacture. U.S. Pat. No. 6,755,948 (Fukuyo et al) discusses the potential effects of particles in the context of titanium targets.

Activities in the sputtering target field are illustrated by reference to a number of patent filings. By way of illustration, U.S. Patent Application No. 20070089984 describes the formation of a large area sputtering target by the use of a powder between cold-isostatically pressed blocks of a mixture of molybdenum and titanium powders. The use of such powder generally results in the formation of a conspicuous joint line between adjoining blocks that may appear as a band. Even if such joint line does not actually adversely affect performance, its conspicuous nature is a potential concern for device manufacturers. For instance, some manufacturers have the perception that the joint line may contribute to the formation of undesired particles during sputtering; if generated, there is a belief that such particles potentially might affect performance of resulting devices.

U.S. Pat. No. 4,594,219 (Hostatter et al) addresses side-by-side consolidation of preforms to form complex or compound shaped articles (e.g., connecting rods and hand wrenches). Consolidation (e.g., by hot isostatic pressing) of molybdenum and/or titanium powder containing performs is not described. Moreover, particular processing steps to achieve successful results in the consolidation of molybdenum and/or titanium powder containing performs is also not described.

U.S. Patent Application No. 20050191202 (Iwasaki et al) discloses a molybdenum sputtering target (in which an example is provided of a 70.0 at % Mo-30.0 at/% Ti material). The application discloses a requirement for use of relatively high temperatures and pressures, stating at paragraph 40 that if a pressure below 100 MPa and a temperature below 1000° C. is used, "it is hard to produce the sintered body having a relative density of not less than 98%". The application describes a process by which a relatively large size body is consolidated from secondary powders and then the sintered body is cut into separate targets. One example illustrates a further hot plastic working step.

U.S. Patent Application Publication 20050189401 (Butzer) discloses a method of making a large Mo billet or bar for a sputtering target wherein two or more bodies comprising Mo are placed adjacent one another (e.g. stacked one on the other) with Mo powder metal present at gaps or joints between the adjacent bodies. The adjacent bodies are hot isostatically pressed to form a diffusion bond at each of the metal-to-Mo powder layer-to-metal joint between adjacent bodies to form a billet or bar that can be machined or otherwise formed to provide a large sputtering target. This patent publication appears to disclose bonding of major side surfaces, not edge-to-edge bonding of plates.

U.S. Patent Application No 20080216602 (Zimmerman et al) describes another method for making large area sputtering targets with a molybdenum-titanium composition, which includes a cold spray deposition step for joining a plurality of targets at an interface. Though acknowledging certain electron beam welding and hot isostatic pressing processes to join targets, in paragraphs 165-166 (referring to FIGS. 17 and 18), the patent application indicates that electron beam welding results in porosity, and the hot isostatic pressing results in a brittle alloy phase.

U.S. Patent Application No. 20070251820 (Nitta et al) describes an example of another approach to the manufacture of a molybdenum-titanium sputtering target. In this publication, diffusion joining (at a temperature of at least 1000° C.) of two or more previously sintered or melted sputter targets along at least one side. The use of a Mo—Ti powder in the joint is described.

U.S. Patent Application No. 20070289864 (Zhifei et al) identifies a need in large area sputtering targets to fill gaps between multiple target sections carried on a common backing plate. The patent illustrates the material deposition processes between adjoining target portions. Interestingly, the patent recognizes that the manufacture of large molybdenum plate targets poses difficulties, and the need for efficient manufacturing.

In view of the above, there remains a need in the art for alternative sputtering targets (especially large size targets, such as targets exceeding about 0.5 meters, about 1 meter, or even about 2 meters for its largest dimension), and approaches to their manufacture that meet one or any combination of the needs for general uniformity of composition, general uniformity of microstructure, insubstantial likelihood of particle formation, relatively thin and virtually invisible joint line between target components, or relatively high strength (e.g., relatively high transverse rupture strength).

SUMMARY OF THE INVENTION

In one aspect, the present teachings meet one or more of the above needs by providing a sputtering target, which may in particular be a relatively large sputtering target (e.g., exceeding about 0.5 meters, about 1 meter, or even about 2 meters for its largest dimension; or stated in another way, exceeding about 0.3 square meters ($m^2$), 0.5 $m^2$, 1 $m^2$, or even 2 $m^2$ for the target sputtering surface available for sputtering), comprising a target body that includes at least two consolidated blocks, each block including an alloy including molybdenum and at least one additional alloying element; and a joint between the at least two consolidated blocks, the joint being free of an added bonding agent (e.g., powder, foil or other added material), and being essentially free of any joint line in a finished target that is visible to the naked eye (in the absence of magnification), wherein the sputtering target body at the joint exhibits a transverse rupture strength per ASTM B528-10, of at least about 400 MPa (e.g., at least about 690 MPa), throughout the target body (including at the joint). The target body generally throughout may have a Vickers Hardness (HVN) per ASTM E384-10 of at least about 260, about 275 or even about 300; for example, it may have an HVN of about 260 to about 325. The target, the target body, the alloy, one or more consolidated blocks, or any combination thereof may include molybdenum in an amount greater than about 30 weight percent. The target, the target body, the alloy, one or more consolidated blocks, or any combination thereof may include molybdenum in an amount greater than about 30 atomic percent. The target, the target body, the alloy, the consolidated blocks, or any combination thereof preferably may include molybdenum in an amount greater than about 30 volume percent. The target body may have a density of at least about 0.92, 0.95 or even 0.98 times the theoretical density of the overall material per ASTM B311-08. For one illustrative target that consists essentially of molybdenum and titanium, the target body may have a density in the range of about 7.12 to about 7.30, and more specifically about 7.20 to about 7.25 $g/cm^3$. The sputtering target body may also be sufficiently strong so that it withstands, without fracture, routine stresses encountered during subsequent assembly operations (e.g., a three point straightening assembly operation, a creep flattening operation, or some other operation during which the target.

In another aspect, the present teachings meet one or more of the above needs by providing a method for making a sputtering target, comprising the steps of: providing first and second blocks (e.g., at least two partially consolidated preform blocks) each having a prepared (e.g., roughened or otherwise modified surface, such as at least one edge) surface and each including an alloy including molybdenum in an amount greater than about 30 percent by weight (wt %), atomic percent (at %) or volume percent (vol %), and at least one additional alloying element; contacting the prepared surface (e.g., one or more edge surfaces) of the first block directly with the prepared surface of the second block in the substantial absence of any powder (or other intermediate material) between the contacted surfaces to form a contacted joint structure; and isostatically pressing the contacted structure at a temperature that is less than 1100° C. (e.g., less than about 1080° C. or even less than about 1000° C.) at a pressure and for a time sufficient to realize a consolidated joint between the first and second blocks that is essentially free of any joint line width greater than about 300 μm (and more preferably that is essentially free of any joint line width greater than about 300 μm).

In yet another aspect of the teachings herein, it is contemplated that sputtering is performed using a sputtering target in accordance with the present teachings. It also is contemplated that thin films result that are used in any of a number of electronic devices (e.g., as a barrier layer, an electrode layer or both), such as one or more of a television, a video display, a smartphone, a tablet computer, a personal digital assistant, a navigation device, a sensor a portable entertainment device (e.g., video players, music players, etc.), or even a photovoltaic device. The thin films may have a reduced amount of structural artifacts attributable to particles as compared with sputtering using targets with powder joints.

DESCRIPTION OF THE DRAWINGS

FIG. 3a is an illustrative light optical photomicrograph at 25× depicting a microstructure expected within the present teachings in which no bonding agent (e.g., no powder, foil or other added material) is employed for joining between blocks of a target body, and in which surface roughness of blocks prior to joining is higher than the surface roughness in the structure of FIG. 2a.

FIG. 3b is an illustrative light optical photomicrograph at 100× depicting a microstructure expected within the present teachings in which no bonding agent (e.g., no powder, foil or other added material) is employed for joining between blocks of a target body, and in which surface roughness of blocks prior to joining is higher than the surface roughness in the structure of FIG. 2a.

DETAILED DESCRIPTION

Figure 1A:
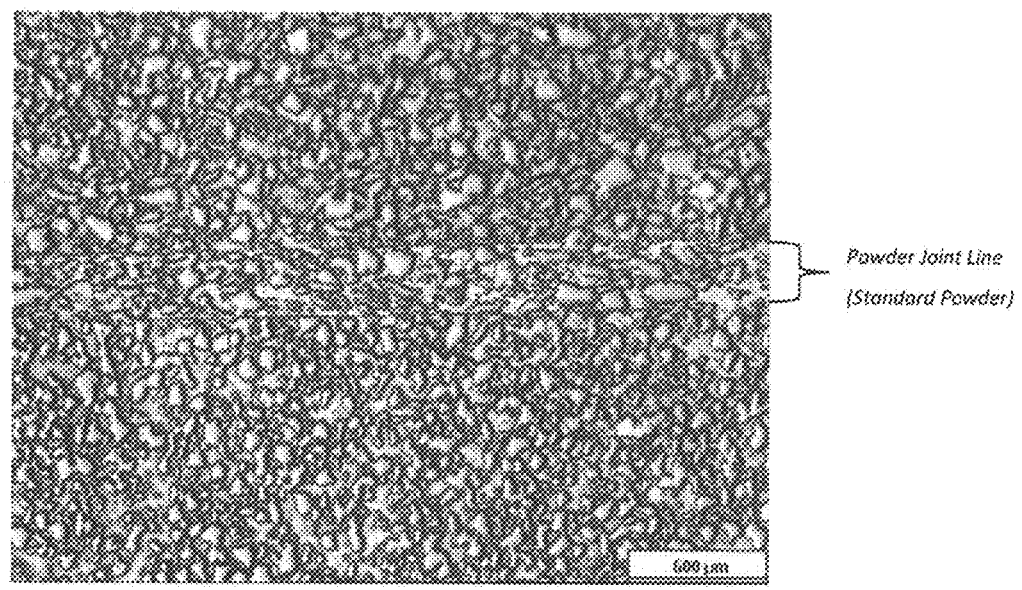
FIG. 1a is an illustrative light optical photomicrograph at 25× magnification of a section of a target body formed using a powder joint, with the span of the bracket therein corresponding with the width of the joint line.

Turning now in more detail to particular teachings of the present invention, in general, the present teachings envision a relatively large sputtering target, and particularly a sputtering target consolidated from metal powder. The target generally will include a target body (namely, the consolidated portion of the target, and specifically the portion of the overall target assembly that is subjected to bombardment for purposes of material removal and sputter deposition) that may be joined to a backing plate in any suitable art disclosed manner. The sputtering target body may be any suitable geometry. It may be generally circular (so that it would have a diameter as its largest dimension). It may be rectangular, and thus have one of its side edges as having its largest dimension (e.g., the length of the side edge). It may be tubular. Though the teachings herein also apply to smaller sputtering targets, they have particular utility for larger scale targets. By way of example, larger scale target bodies may be sized such that they exceed about 0.5 meters, about 1 meter, or even about 2 meters for its largest dimension. Examples of such target bodies may be generally rectangular targets having a length that exceeds about 0.5 meters, about 1 meter, or even about 2 meters. Such target bodies may have a width that exceeds about 0.5 meters, about 1 meter, or even about 2 meters. The resulting target bodies may exceed about 0.3 square meters ($m^2$), 0.5 $m^2$, 1 $m^2$, or even 2 $m^2$ for the target sputtering surface available for sputtering.

The target body is typically made to include at least two consolidated preformed blocks. The consolidated blocks will typically be sized (e.g., length, width, area, or any combination thereof) to be smaller than the overall resulting target body. For example, they may be about one half (or smaller) the size (e.g., length, width, or area) of the desired resulting target body (e.g., they may be about 1/n the size of the desired resulting target body, wherein n refers to the total number of consolidated blocks). Each of the consolidated blocks may each be approximately the same size as each other block. One or more consolidated block may be smaller than another other blocks. The blocks may be of generally the same shape as each other, or they may differ as to shape. The blocks may have a generally rectangular prism shape. The blocks may be generally cylindrical. The blocks may include one or more channels, through holes or other openings. For example, the blocks may be generally cylindrical and have a through passage for defining a tubular shaped block. One or more side walls of the block may be generally orthogonally oriented relative to a surface that will function as a sputtering surface. One or more side walls of the block may be generally oriented at a slope angle of at least ±5°, 10°, 20° or more relative to a plane that would be perpendicular to a sputtering surface. In this manner it is possible that a joint may employ a scarf joint between adjoining blocks. Other joint structures other than a butt joint or a scarf joint may be employed, such as a lap joint, dovetail joint, or any combination of the above joints.

More particularly, a plurality of blocks are prepared by consolidating powdered metal. The consolidation may occur from sintering, cold isostatic pressing, hot isostatic pressing, otherwise compacting (e.g., rolling, die compacting or both) or any combination thereof. For example, one approach is to first compact to a predetermined density that is less than the theoretical density of the material. This may be done, for example, by cold isostatically pressing a mass of powders of the desired composition (such as is taught in U.S. Patent Application No. 20070089984 at paragraph 50 through 53, incorporated herein by reference (Gaydos et al)). The resulting compacted forms may be machined to form block precursor structures. The blocks (or block precursor structures) may be further densified such as by hot isostatically pressing. The resulting consolidated blocks are then joined together to form a target body by hot isostatically pressing two of more blocks (e.g., while encapsulated in a suitable hot isostatic pressing container), preferably under conditions so that the resulting blocks are joined together without any added bonding agent (e.g., in the absence of any powder, foil or other added material within the space between adjoining blocks).

It is contemplated that the starting powdered metals, before consolidation, will include one or more powders of a substantially pure metal (e.g., having a purity (defined to mean free of metallic elements) of at least about 99.5%, 99.95% or even 99.995% purity)).

The powders, before consolidation will typically have an average particle size of less than about 50 µm, or even less than about 35 µm, as measured according to ASTM B822-10. For example molybdenum powders, before consolidation will typically have an average particle size of less than about 25 µm, or even less than about 5 µm, as measured according to ASTM B822-10. When titanium is employed, the titanium powders may have an average particle size of less than about 50 µm, or even less than about 35 µm. The titanium powders may have an average particle size of higher than about 5 µm, or even higher than about 25 µm.

Prior to consolidation, powders may be blended in accordance with art disclosed powder blending techniques. For example, mixing may occur by placing the molybdenum and titanium powders in a dry container and rotating the container about its central axis. Mixing may be continued for a period of time sufficient to result in a completely blended and uniformly distributed powder. A ball mill or similar apparatus (e.g., rotating cylindrical, rotating cone, double cone, twin shell, double planetary, and/or sigma-blade blender) may also be used to accomplish the blending step.

The composition in each block of the resulting target body will generally include molybdenum and at least one additional alloying element. For example, the composition may include an alloy including molybdenum in an amount so that in the resulting target body there is a substantially pure phase of molybdenum present in an amount greater than about 30 vol %, greater than about 35 vol %, or even greater than about 40 vol % of the resulting target block, body or both. The composition may include an alloy including molybdenum in an amount so that in the resulting target body there is a substantially pure phase of molybdenum present in an amount less than about 50 percent by weight or volume, less than about 48 percent by weight or volume, or even less than about 45 percent by weight or volume (e.g., about 43 percent by weight or volume) of the overall block, body or both. The amount of the molybdenum in the target, the alloy, or both, may range from about 5 to about 95 at %, more preferably about 20 to about 80 at %, still more preferably about 30 to about 70 at %. It may be about 40 to about 60 at % (e.g., about 50 at %). The remaining alloying elements may make up the balance. For example, the amount of titanium in a system employing only molybdenum and the additional alloying element powder may be about 100 at % minus the amount (in at %) of molybdenum. Thus, as can be seen from the above, the teachings contemplate a composition of the target, the alloy, or both, of about 30 to about 70 at % Mo (e.g., about 35 to about 65 at % Mo, or even about 40 to about 60 at % Mo) and the balance being the at least one additional alloying element, such as titanium (e.g., about 50 at % Mo and about 50 at % of another element (such as titanium)).

The at least one additional alloying element may be a metallic element, such as one selected from titanium, chromium, niobium, zirconium, tantalum, tungsten or any combination thereof. It is possible that that at least one additional alloying element may include hafnium and/or vanadium. It is also possible that the at least one additional alloying element may include one or more alkali metal (e.g., lithium, sodium and/or potassium in an amount of less than about 10 at % or even 5 at % of the total composition). Examples of suitable alloying ingredients are disclosed in PCT Application No. WO2009/134771, and U.S. application Ser. Nos. 12/990,084; 12/827,550 and 12/827,562 (all incorporated by reference). The amount of the at least one additional alloying ingredient may be such that it will result in (i) a substantially pure phase of that alloying element; and/or (ii) an alloy phase that includes molybdenum and the at least one alloying element. By way of example, the amount of the at least one additional alloying element may be sufficient to obtain a substantially pure phase of the at least one additional alloying element that is at least about 1, 2, 4 or even about 6 vol % of the resulting target body, block or both. The amount of the at least one additional alloying element may be sufficient to obtain a substantially pure phase of the at least one additional alloying element that is less than about 30 vol %, 25 vol %, 15 vol % or even about 10 vol % of the resulting target body, block or both.

The amount of each of the molybdenum and the at least one additional alloying element may be sufficient to realize, in the resulting target body, block or both, an alloy phase (i.e., one that includes both molybdenum and the at least one additional alloying element) in an amount greater than about 30 vol %, 40 vol %, 44 vol % or even about 48 vol %. For example, the alloy may be present as a major constituent of the block, by volume. The amount of each of the molybdenum and the at least one additional alloying element may be sufficient to realize in the resulting target body an alloy phase that includes both molybdenum and the at least one additional alloying element in an amount less than about 70 vol %, 60 vol %, 56 vol % or even about 52 vol %. As can be seen, the alloy phase may be present as a major constituent by volume of the block, body or both.

By way of illustration, in the context of a Mo—Ti starting powder mixture material, the resulting target body, both in the original target blocks and at the joints, is expected to have a vol % pure Mo phase of about 30 to about 50% (e.g., about 35 to about 48%, or even about 40 to 45%), a vol % pure Ti phase of about 1 to about 25% (e.g., 2 to about 15% or even about 5 to 10%) and a vol % of alloy phase of about 30 to about 70% (e.g., about 40 to about 60% or even about 45 to 55%).

The resulting target bodies of the teachings herein may have some oxygen content therein. Oxygen may be present in an amount less than about 5000 ppm or less than about 4000 ppm. Oxygen may be present in an amount greater than about 100 ppm, or even about 500 ppm For example, a resulting oxygen weight concentration of the blocks of the sputtering target may be between about 1000 ppm and 3500 ppm.

The resulting target body may be further characterized by at least one, preferably a combination of at least two features, more preferably a combination of at least three features, still more preferably a combination of at least four features, and even still more preferably a combination of all features selected from the following features (i) through (v): (i) at least one joint between at least two consolidated blocks (e.g., side-by-side or end-to-end adjoining blocks) that is free of an added bonding agent (e.g., powder, foil or otherwise); at least one joint between at least two consolidated blocks (e.g., side-by-side or end-to-end adjoining blocks) being essentially free of any ostensible band or joint line of greater than about 300 μm width (with the width being the average distance between opposing ends of end-to-end adjoined blocks along the length of the joint) and more preferably free of any joint line of greater than about 200 μm width, 100 μm width, or even about 50 μm width), where the width is the distance spanning in the direction between opposing sides of adjoining blocks; (iii) a sputtering target body that is at least about 0.5 meters, about 1 meter, or even about 2 meters, along its largest dimension, and which exhibits a transverse rupture strength per ASTM B528-10 that is generally uniform (e.g., the fluctuation from low to high is less than about 50% the highest value, or even less than about 35% of the highest value) throughout the body, including across the joint, and which may be at least about 400 MPa, 500 MPa, 600 MPa, 700 MPa, 800 MPa or even 900 MPa; (iv) the target body exhibits a Vickers Hardness (HVN) of at least about 260, about 275 or even about 300 (e.g., it may have an HVN of about 260 to about 325); or (v) the target body may have a density of at least about 0.92, about 0.95 or even about 0.98 times the theoretical density of the overall material (e.g., for a target body that consists essentially of molybdenum and titanium, the target body may have a density in the range of about 7.12 to about 7.30, and more specifically about 7.20 to about 7.25 g/cm$^3$). The sputtering target body may also be sufficiently strong so that it withstands, without fracture, routine stresses encountered during subsequent assembly operations (e.g., a three point straightening assembly operation, a creep flattening operation, or some other operation during which the target body and any joint may be subjected to a load of greater than about 0.6 MPa). Methods herein thus may include one or more steps of performing an assembly operation (e.g., an assembly operation selected from a three point straightening operation, a creep flattening operation, or both). As discussed previously, another aspect of the present teachings, which is believed to result in sputter target bodies that exhibit one or more of the features of the previous paragraph pertains to a methods for making a sputtering target. Broadly stated, the methods include steps of consolidating at least two blocks into performs, and joining the blocks together. The joining of the blocks is desirably done under heat and pressure, and in a manner that otherwise avoids the need for reliance upon an intermediate bonding agent (e.g., powder, foil or otherwise) between opposing surfaces of the blocks as a primary mode of assuring a bond between the blocks. Rather, desirably, the bonding of adjoining blocks relies mainly upon the formation of at least some metallic bonds (with some mechanical bonding being possible as well) between metal from opposing surfaces of the blocks.

Accordingly, one approach involves a step of making a plurality of consolidated blocks as preforms. The preforms may have substantially the same composition as each other. The preforms may be made in a substantially identical manner as each other. The preforms may be consolidated in any suitable manner. The blocks of the preforms may be any suitable geometry. For example, they may be generally rectangular prisms. They may be generally cylindrical. They may be hollow (e.g., tubular). Other shapes are also possible.

Typically the manufacture of the blocks will employ a powder starting material. The powder may be densified by the application for a desired period of time of heat, pressure or both. For example, they may be compacted, sintered, cold isostatically pressed, hot isostatically pressed or any combination thereof. An initial compaction step may occur. For example, an initial step may be employed to compact a mass of powder to about 50 to about 85% of theoretical density (e.g., about 60 to about 70% of theoretical density). This may be done by a suitable cold isostatic pressing operation.

One or more secondary operations may also be performed, such as a cold working step, a hot working step, an annealing step, or otherwise.

A preferred approach to consolidation includes a step of hot isostatically pressing (HIP) a mass (e.g., an uncompacted powder mass or a compacted powder mass) at a pressure of at least about 100 MPa. The HIP process desirably may be performed at a temperature below about 1080° C. (e.g., at about 1050° C.), 1000° C., 950° C., 900° C., or even below about 850° C. (e.g., at about 825° C.). The HIP process may range in duration from about 1 to about 12 hours, and more preferably about 4 or 6 to about 10 hours (e.g., about 8 hours). By way of example, without limitation, the mass may be pressed to generally rectangular blocks having a thickness of about 10 mm to about 60 mm, and more preferably about 15 mm to about 45 mm (e.g., about 15 mm, about 25 mm, about 35 mm or even about 45 mm). The mass may be pressed into a generally rectangular block having a width of about 25 to about 100 mm (e.g., about 30 mm, about 50 mm or even about 90 mm), and more preferably from about 30 mm to about 50 mm. The mass may be pressed into a generally rectangular block having a length of about 70 mm to about 160 mm, and more preferably about 90 mm to about 150 mm (e.g., about 90 mm, about 120 mm, or even about 150 mm).

Two, three, or more blocks are joined to form a target body. As mentioned, preferably this is done in without employing a bonding agent (e.g., a powder, a foil or any other added material) as the primary means of joining. For example, though some amounts of a bonding agent may be employed, aspects of the present teachings contemplate that the joining, to make the target body, may be achieved in the absence of any bonding agent. By way of illustration, two blocks may be prepared, each having dimensions of about 1.5 meters long by about 0.9 meters wide by about 0.16 meters thick. They may be joined together along opposing width edges to form a target body. In another illustration, two blocks may be prepared, each having dimensions of about 1.2 meters long by about 0.5 meters wide by about 0.46 meters thick. They may be joined together directly along opposing length edges to form a target body. In still another illustration, two blocks may be prepared, each having dimensions of about 1.2 meters long by about 0.5 meters wide by about 0.3 meters thick. They may be joined together, in end-to-end direct contact with each other (absent any intermediate materials), along opposing length edges to form a target body. In still yet another illustration, three blocks may be prepared, each having dimensions of about 0.9 meters long by about 0.3 meters wide by about 0.25 meters thick. They may be joined together end-to-end along opposing length edges to form a target body. More than three blocks can be employed, such as an array of two or more blocks along two or more axes.

Following the pressing, but prior to the joining of the perform blocks to form a sputter target body, one or more surfaces of the perform blocks may be surface prepared (e.g., surface roughened and/or polished, whether chemically, mechanically, electrochemically, a combination thereof or otherwise) to impart a desired surface finish, such as for increasing surface area of the surface for contacting an adjoining block as compared with a surface that is not surface prepared, or for otherwise increasing contact area between two or more adjoining blocks. For example, surfaces that are to oppose each other when joined desirably are prepared (e.g., roughened). They may be prepared so as to achieve an arithmetic average surface roughness $R_A$ (as measured by ASTM B946-06) that may be at least about 50 μ-in (1.3 μm), or even at least about 100 μ-in (2.6 μm) (e.g., about 120 μ-in (3 μm) to about 150 μ-in (3.8 μm)). They may be prepared so as to achieve an arithmetic average surface roughness $R_A$ (as measured by ASTM B946-06) that may be less than about 200 μ-in (5.1 μm), less than at least about 180 μ-in (4.6 μm), or even less than about 150 μ-in (3.8 μm), or even less than about 120 μ-in (3 μm). For example, the arithmetic average surface roughness $R_A$ (as measured by ASTM B946-06) may range from about 50 μ-in (1.3 μm) to about 150 μ-in (3.8 μm)), and more specifically about 63 μ-in (1.6 μm) to about 125 μ-in (about 3.2 μm).

After any surface preparation (e.g., surface roughening), at least one prepared surface of a first block is contacted (e.g., directly and in the absence of any intermediate bonding agent such as powder, foil or other material) with at least one prepared surface of a second block to form a contacted joint structure. The blocks may be contacted end-to-end along their respective side edges (e.g., at least partially along a length or a width of each block). It also may be possible to stack two or more blocks, e.g., in face-to-face opposing relationship. The contacted blocks desirably are encapsulated in a pressing vessel, such as a suitable hot isostatic pressing container (e.g., a mild steel can that is hermetically sealed for pressing). They are then hot isostatically pressed to a desired shape at a temperature that is less than 1100° C. (e.g., about 1080° C., or about 1000° C. or less) and at a pressure and for a time sufficient to realize a consolidated joint between the first and second blocks. A preferred approach may include a step of hot isostatically pressing a powder mass at a pressure of at least about 75 MPa, or even at least about 100 MPa. A preferred approach may include a step of hot isostatically pressing a powder mass at a pressure of less than about 300 MPa, less than about 250 MPa, or even less than about 175 MPa. The HIP process desirably may be performed and at a temperature below about 1080° C. (e.g., about 1050° C.), below about 1000° C., below about 950° C., or even below about 900° C. (e.g., at about 890° C.). As such, the HIP process may be free of a step of heating the powder, the can, or both to a temperature of about 1100° C. or higher. As seen, it is also possible that the HIP process may be free of a step of heating the powder, the can, or both to a temperature of about 1000° C. or higher. The HIP process may range in duration from about 1 to about 16 hours, and more preferably about 3 to about 8 hours (e.g., about 4 hours). After the pressing is completed, the can may be removed. Other details about pressing operations can be gleaned from U.S. Pat. No. 7,837,929 ((Gaydos et al) incorporated by reference) (see e.g., the Examples).

As seen from the above, resulting target bodies are of powdered metal origin and are typically subjected to at least two separate hot isostatic pressing operations at temperatures in excess of about 800° C., at a pressure greater than about 75 Mpa, and for a period of at least one hour. Unlike in methods that employ a loose powder in the processing for bonding joints there is no joint component (e.g., the loose powder, foil or other added material) that is subjected to only a single hot isostatic pressing operation, and also will be subject to a different axial pressure conditions as compared with the adjoining blocks. Additionally, in contrast with methods that employ a loose powder between blocks for joining the blocks, it is possible to avoid formation of a band of material (e.g., visible to the naked eye) between adjoining blocks that may have a different morphology, average grain size, phase content or any combination, as compared with the adjoining blocks.

In yet another aspect of the teachings herein, it is contemplated that sputtering is performed using a sputtering target in accordance with the present teachings. It also is contemplated that thin films result that are used in any of a number of electronic devices (e.g., as a barrier layer, and electrode layer or both), such as one or more of television, a video display, a smartphone, a tablet computer, a personal digital assistant, a navigation device, a sensor, a photovoltaic device, or a portable entertainment device (e.g., video players, music players, etc.).

The thin films may have a reduced amount of structural artifacts attributable to particles as compared with sputtering using targets with powder joints, and are substantially uniform in structure (e.g., greater than about 98%). The thin films may have a thickness of less than about 350 nm, less than about 225 nm, or even less than about 100 nm. The thin films may have a thickness of greater than about 5 nm, or even greater than about 10 nm. For example, the films may have a thickness of about 15 to about 25 nm. The thin films may exhibit a resistivity value of about 70 to about 90, or even about 75 to about 85 μΩcm (using a four point probe). The thin films may exhibit a 5B adhesion rating for adhesion to a substrate made of either Corning 1737 glass or amorphous silicon (e.g., amorphous silicon coated glass per ASTM D:3359-02). The thin films preferably exhibit good interfacing capability with copper or other metal conductors, such as copper conductive layers in display devices.

The targets herein may be made in a process that is free of any hot working step, any forging step, or both. Though the temperatures for hot isostatic pressing preferably are below 1100° C., they may be about 1100° C. or higher, or even 1200° C. or higher. Though the joint preferably is free of any bonding agent, it is possible that small quantities of bonding agent (e.g., a powder, a foil or both may be employed). For example, it is possible that the teachings herein may include a step of diffusion bonding two or more adjoining blocks with a relatively small quantity of a powder (e.g., for a system that includes Mo and at least one other element, Mo powder alone, the other element powder alone, or a mixture of powders of Mo and such other elements). In such instance, the amount of powder may be an amount that will result in a conspicuous joint line (which may be of sufficient width to appear visually as a band) from the powder interface that is less than about 200 μm in width, less than about 100 μm in width or even less than about 50 μm in width.

The teachings herein contemplate that resulting target body materials include at least one pure metallic elemental phase, such as pure Mo (and more preferably at least two pure metallic elemental phases, such as pure Mo and pure Ti), along with at least one alloy phase (e.g., β(Ti, Mo) phase), However, it is possible that the resulting target body will have substantially no alloy phase, such as a β(Ti, Mo) phase (i.e., about 15% (by volume) or less of the β-phase).

The microstructure of resulting target bodies preferably is substantially uniform throughout the body. In a typical target body that includes molybdenum and at least one other element (e.g., Ti), the microstructure preferably exhibits a matrix of pure molybdenum, with regions of the other element distributed substantially uniformly throughout the matrix. Regions of the other element phase (e.g., titanium phase) are generally equiaxed. Regions of the other element phase (e.g., pure titanium phase) may vary in size substantially uniformly throughout the body. For example, such regions may achieve a largest region diameter on the order of about 200 μm. Regions of the pure element phase (e.g., pure titanium phase) may have an average region diameter of about 50 to about 100 μm.

Bonding of adjoining blocks may be end-to-end, and thus may take place along a side edge of a block. It may be face-to-face, and thus may be across a face of a block (e.g., an upper major surface of one block opposing a lower major surface of another block), or both.

Figure 4:
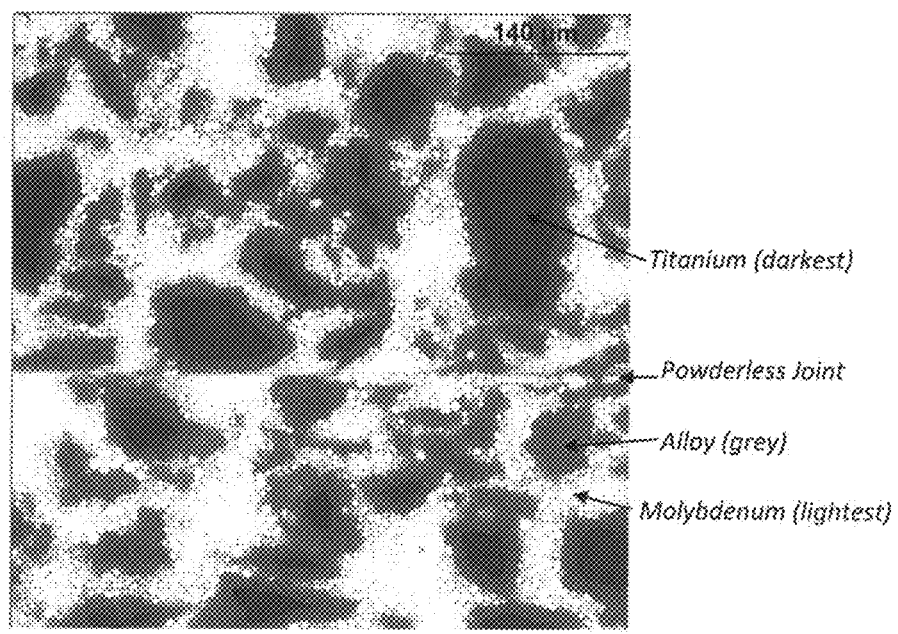
FIG. 4 is an illustrative scanning electron microscope backscatter photomicrograph at 500× for illustrating phases typically expected in a hot isostatically pressed target body made from blocks having a mixture of 50 at % molybdenum and 50 at % titanium powders, as described in Example 1, which are joined together in the absence with no bonding agent (e.g., no powder, foil or other added material).

As to all of the teachings herein, including those in the following examples, the volume percent of the respective phases are determined by a method that follows the principles from ASTM standards E562 and E1245. Following this method, an SEM backscatter detection (BSE) mode image is taken such that the phases are distinguishable by the intensity of pixels in a black-and-white image. Using BSE mode, the number of scattered electrons will be directly related to atomic number, so heavier elements will appear brighter. For example, the large difference in atomic number of Mo (42) and Ti (22) makes the identification of each element possible from a backscatter image. The alloy phase will typically appear gray, with an intensity between brightest pure elemental (e.g., Mo) regions (showing as the most white) and the darkest pure elemental (e.g. Ti) regions, as illustrated in FIG. 4 below. By analyzing a pixel intensity histogram (8-bit image; intensities from 0-255), thresholds can be defined and the area percentage of each phase can be calculated by a pixel count of the intensity range for each phase. Since the material is believed to be substantially homogeneous with no preferred direction for any phase, the area percentage is treated as being equal to the volume percentage of each phase. For the above analysis, the person skilled in the art will recognize that it is possible that the thresholds may be defined in an objective manner by measuring the minima between peaks in a pixel intensity histogram derived from the BSE image. For example, these minima can be calculated by fitting a 2nd-order polynomial equation to the histogram data at the regions between peaks. The skilled artisan will readily understand that, due to potential minor fluctuations across a sample, an average may be taken of multiple measurements (e.g., measurements may be taken at five locations across a sample). Thus, except as stated herein otherwise (e.g., with reference to FIG. 4 below, where a single measurement is illustrated), the expression of results of measurements of the phase concentrations herein contemplate an average concentration across a sample.

By way of illustration, with reference to FIG. 4, there is shown generally an illustrative microstructure that may be expected for a Mo—Ti target body prepared by hot isostatic pressing of a metal powder mixture having about 50 at % Mo and 50 at % Ti, in accordance with the teachings generally herein (and particularly following the teachings of Example 1). In these scanning electron microscope images (in backscatter electron detection mode), the pure titanium phase is the darkest phase. The medium shaded phase essentially surrounding the titanium is a titanium/molybdenum alloy phase (e.g., believed to be a β-phase, but which has varying concentrations of titanium and molybdenum throughout), and the lightest phase is molybdenum. For the structure depicted in FIG. 4, there is seen to be a volume percentage of n-phase of about 52.9 vol. %, about 40.9 vol % Mo and about 6.1 vol % Ti. The sample itself may have a slightly higher or slightly lower overall phase concentration upon taking multiple measurements at different locations across the sample.

With further reference to the accompanying illustrative figures, in the following examples, there is illustrated a relative comparison of structures expected to be realized by practicing the teachings of prior art (i.e., FIGS. 1a and 1b), in which a powder bonding agent is employed in a joint between adjoining blocks. In contrast, the FIGS. 2a, 2b, 3a, 3b, and 4 illustrate structures expected to be realized by practice consistent with the present teachings, in which a powder bonding agent is omitted in a joint between adjoining blocks.

As the person skilled in the art will appreciate from the above discussion and the description that follows, the present teachings contemplate one or more of the following characteristics and/or variations. The methods herein may include or may be free of any step of pulverizing a previously compacted powder (e.g., it is free of any step of pulverizing a green compact). Prior to any final consolidation step, the methods may include or may be free of any step of employing a secondary powder phase, such as that addressed in Published United States Patent Application No. 20050230244. The methods herein may include or may be free of any step of forming a cast metal ingot preform block that is thereafter processed for forming a joined target. The methods herein may include or may be free of any step of welding (e.g., friction stir welding) of two or more preform blocks. The methods herein may include or may be free of any step of thermo-mechanical working (e.g., rolling) of a preform block, a consolidated target or both. The methods herein may include or may be free of any step of annealing or other heat treating.

PRIOR ART EXAMPLE

Figure 1B:
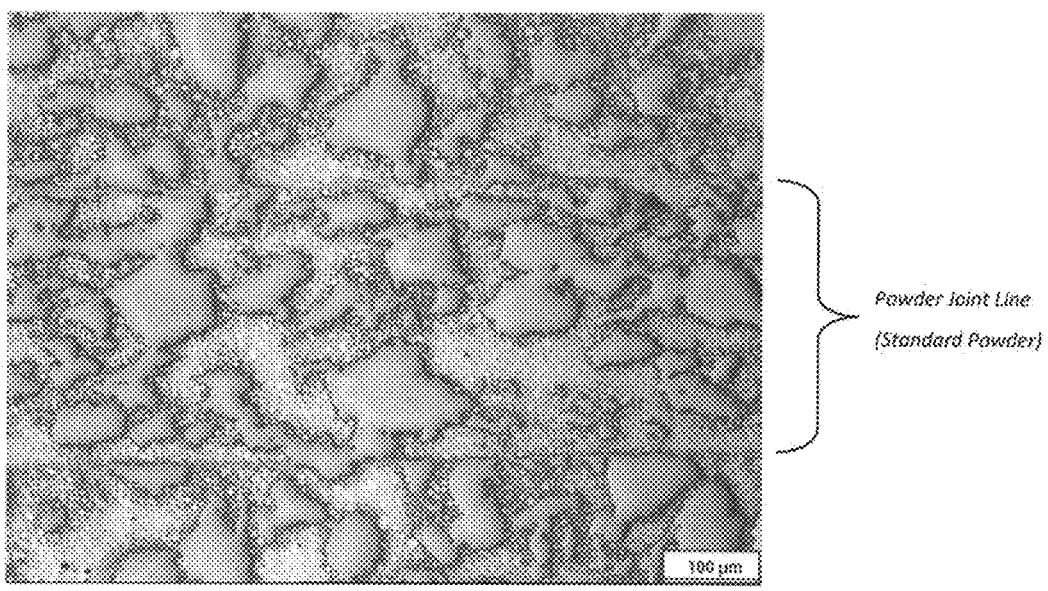
FIG. 1b is an illustrative light optical photomicrograph at 100× magnification of a section of the target body of FIG. 1a formed using a powder joint, with the span of the bracket therein corresponding with the width of the joint line.

For this example, preform blocks are made by hot isostatically pressing an amount of 50 at % molybdenum powder and 50 at % titanium powder at a temperature of about 825° C., for a time of about 8 hours and at a pressure of about 175 MPa. The blocks are then placed in a hot isostatic press container with a powder mixture of about 50 at % Mo and 50 at % Ti between them. The powder includes titanium powder (Grade Ti-050, having an average particle size of about 45 to about 150 µm, from Reading Alloys) and molybdenum powder (MMP-7, having an average particle size less than about 70 µm, from H. C. Starck). The powder is handled to avoid molybdenum powder agglomeration. The blocks (with powder between them) are then hot isostatically pressed at a temperature of about 890° C., for a time of about 4 hours and at a pressure of about 100 MPa. Sections are taken of the resulting target body material and examined microscopically by optical microscope. They are also examined by the naked eye, which reveals a conspicuous band line at the joint. For illustration purposes, the joint line width for the example here averages about 300 µm. Typical commercial scale products, however, will employ a joint line on the order of about 1 to about 1.5 mm wide. FIG. 1a is an illustrative photomicrograph at 25× magnification of a section of the target body. FIG. 1b is an illustrative photomicrograph at 100× magnification of a section of the target body. In each of sections shown in FIGS. 1a and 1b a visible band of material can be seen as a joint line in the region where the powder is placed before the second hot isostatic pressing operation. Such band is shown as having a width on the order of about 300 µm. Other differences in microstructure may also exist in such samples, such as a lower concentration of alloy phase in the joint than in the regions within the original blocks. The morphology of the pure titanium phase, the pure molybdenum phase or both may also differ from the morphology of such phases in the original blocks, believed to be caused potentially by a greater degree of uniaxial compression to which the joint is subjected during pressing. As mentioned previously, the presence of one or any combination of the above differences between the material in the regions of the joint and the original blocks is believed by some to be a potential source of formation of particles that may be emitted during sputtering, inasmuch as such differences potentially may affect the uniformity of electrical field over the target during sputtering.

The sample is expected throughout to have a vol % pure Mo phase of about 40 to 45%, a vol % pure Ti phase of about 5 to 10% and a vol % of alloy phase of about 45 to 55%, within the original blocks, and may have a slightly lower concentration of the alloy phase (and higher amounts of the pure Mo and Ti) at the joint. The different concentration of phases within the target body is believed due, at least in part, to the different thermal history to which powdered starting materials are subjected. For example, the powder of the blocks undergoes two high temperature operations, while the powder of the joint only undergoes one. Accordingly, as can be appreciated, the volume and/or the sizes of the individual regions of pure titanium and molybdenum phases may differ also as between the material in the joint and in the regions from the original blocks. It is expected that the transverse rupture strength at the joint will be about 690 to about 760 MPa.

Example 1

For this example, perform blocks are made by hot isostatically pressing an approximate amount of 50 at % molybdenum powder (average particle size of less than about 70 µm, as described above) and 50 at % titanium powder (average particle size of about 45 to about 150 µm, as described above) at a temperature of about 825° C., for a time of about 8 hours and at a pressure of about 175 MPa. Blocks are water jet cut into a puck shape with an outer diameter of about 10 cm. Edges of the puck shaped blocks are surface machined (e.g., by a first rough milling step, followed by a second milling step) to a surface roughness value (per ASTM B946-06) or $R_A$ between 120 and 150 µin (3.2 to 3.8 µm). The blocks are then placed in a hot isostatic press container with prepared edges adjoining each other, in the absence of any powder mixture between them. The blocks (with no powder between them) are then hot isostatically pressed at a temperature of about 890° C., for a time of about 4 hours and at a pressure of about 100 MPa. Sections are taken of the resulting target body material and examined microscopically by optical microscope. They are also examined by the naked eye, during which a joint line is seen as only faintly visible. Such joint line width is substantially smaller than 50 µm, and no band of any appreciable width is visible.

Similar microstructural results and properties are believed possible for this Example and Example 2 by using blocks that are pre-formed by being hot isostatically pressed at about 750° C., for a time of about 4 hours and at a pressure of about 175 MPa, and then heat treated at a temperature of about 750° C. for about 5 hours.

Figure 2A:
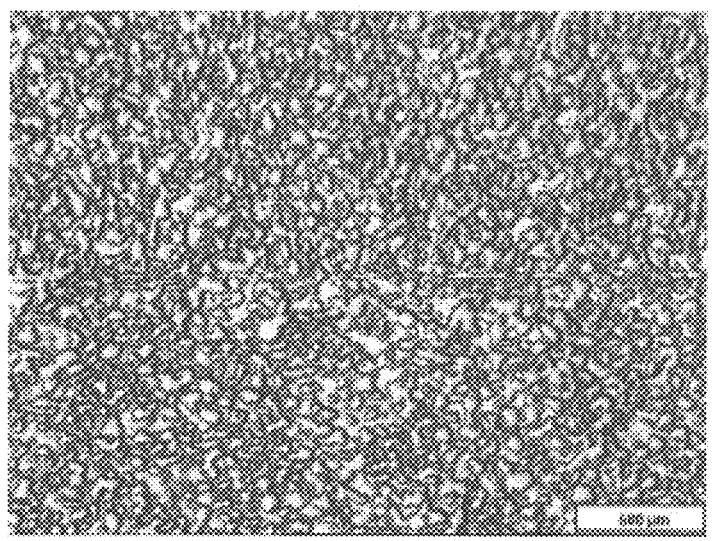
FIG. 2a is an illustrative light optical photomicrograph at 25× depicting a microstructure expected within the present teachings in which no bonding agent (e.g., no powder, foil or other added material) is employed for joining between blocks of a target body.
Figure 2B:
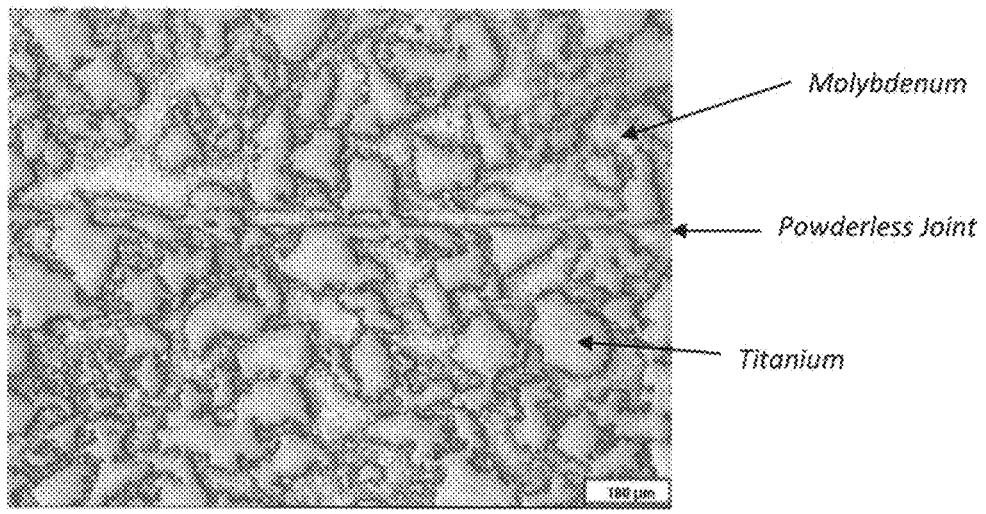
FIG. 2b is an illustrative light optical photomicrograph at 100× depicting a microstructure expected within the present teachings in which no bonding agent (e.g. no powder, foil or other added material) is employed for joining between blocks of a target body.

FIG. 2a is an illustrative photomicrograph at 25× depicting a microstructure expected within the present teachings in which no bonding agent is employed between blocks of a target body. FIG. 2b is an illustrative photomicrograph at 100× depicting a microstructure expected within the present teachings in which no bonding agent is employed between blocks of a target body. In these micrographs the titanium is shown as the lighter grey bodies. The molybdenum is shown also as grey bodies, but appears generally as a continuous network surrounding the Ti particles. Regions of the pure titanium phase appear to be substantially uniformly distributed throughout the body. Regions of the pure titanium phase are generally equiaxed. The uniform distribution and equiaxed shape of the titanium regions across the entire target body that is attainable by the teachings herein is believed to contribute to consistent and uniform sputtering behavior across the entire target body and is also believed to contribute to the absence of undesired particle formation.

As also apparent, regions of the pure titanium may vary in size substantially uniformly throughout the body, and may achieve a largest region diameter on the order of about 200 µm. Regions of the pure titanium have an average region diameter of about 50 to about 100 µm.

As illustrated, surrounding one or more (or even substantially all) titanium regions may be an alloy of molybdenum and titanium, which may be of varying composition. The volume of the alloy phase, and/or the thickness of any surrounding layer of it is typically time and/or temperature dependent. For instance, as the time and temperature of the processing steps is increased, the volume and/or thickness of the alloy phase is expected to grow. Pure molybdenum regions will generally surround the titanium, and the alloy phase, and will form a generally continuous molybdenum network throughout the target body.

As can be seen, a target body is made by joining two blocks where the joint between the two original blocks is free of any bonding agent. In this manner, substantially the entirety of material in the target body experiences the same thermo-mechanical processing and is therefore expected to have common microstructural characteristics, such as is depicted. The joints seen in FIGS. 2a and 2b (which joint is to be expected for other bodies prepared in accordance with the teachings herein, as well) can be characterized (when magnified by at least 25×) by a mere faint interruption in the continuity of the microstructure, but without any significant changes across the joint. The microstructure on either side of the joint is essentially indistinguishable from the microstructure on the other side. There is an absence of coarsening of grains at the joint. Grains at the joint desirably are of substantially identical morphology as grains within the central portions of the original blocks. In some cases, the effects of preparing the surface for powderless bonding can be seen by a smearing of the material at the joint due to machining with a mill, lathe or grinding tool. It may be possible to reduce the incidence of the smearing by employing one or more suitable surface preparation techniques, such as by etching. The sample is expected to have a transverse rupture strength at the joint per ASTM B528-10 of at least about 400 MPa (e.g., about 690 MPa or more), a Hardness of 275-310 by ASTM E384-10, and a density of about 7.15-7.30 by ASTM B311-08. As discussed, FIG. 4 corresponds with a structure resulting from sample preparation as may be used to prepare samples of FIGS. 2a and 2b respectively, and depict the microstructures in backscatter mode. As seen, even without any added powder at the joint, it is surprisingly possible to still realize good mechanical properties, even comparable to powder joints of the prior art. Further, the microstructure does not appear to be compromised by the absence of the intermediate powder.

Example 2

For this example, perform blocks are made by hot isostatically pressing an amount of 50 at % molybdenum powder and 50 at % titanium powder at a temperature of about 825° C., for a time of about 8 hours and at a pressure of about 175 MPa. Puck-shaped blocks (e.g., generally cylindrical bodies having an outer diameter of about 10 cm) are cut from the pressed blocks by a waterjet cutter. Surfaces of the puck-shaped blocks are surface machined (e.g., by milling) to a surface roughness value (per ASTM B946-06) or $R_A$ in excess of 150 µmin. The puck-shaped blocks (with no powder between them) are then hot isostatically pressed at a temperature of about 890° C., for a time of about 4 hours and at a pressure of about 100 MPa. Sections are taken of the resulting target body material and examined microscopically by optical microscope, revealing a substantially uniform microstructure. They are also examined by the naked eye, which reveals only a faint and barely visible joint line.

Figure 3A:
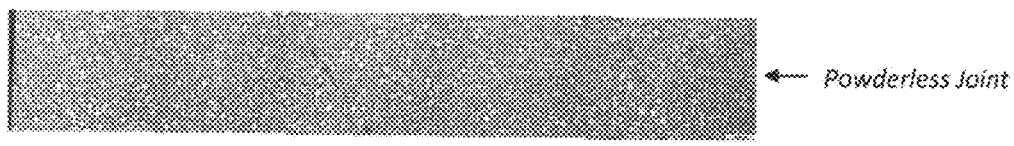

FIG. 3a is an illustrative photomicrograph at 25× depicting a microstructure expected within the present teachings in which no bonding agent is employed between blocks of a target body, and in which surface roughness of blocks prior to joining is higher than the surface roughness in the structure of FIG. 2a.

Figure 3B:
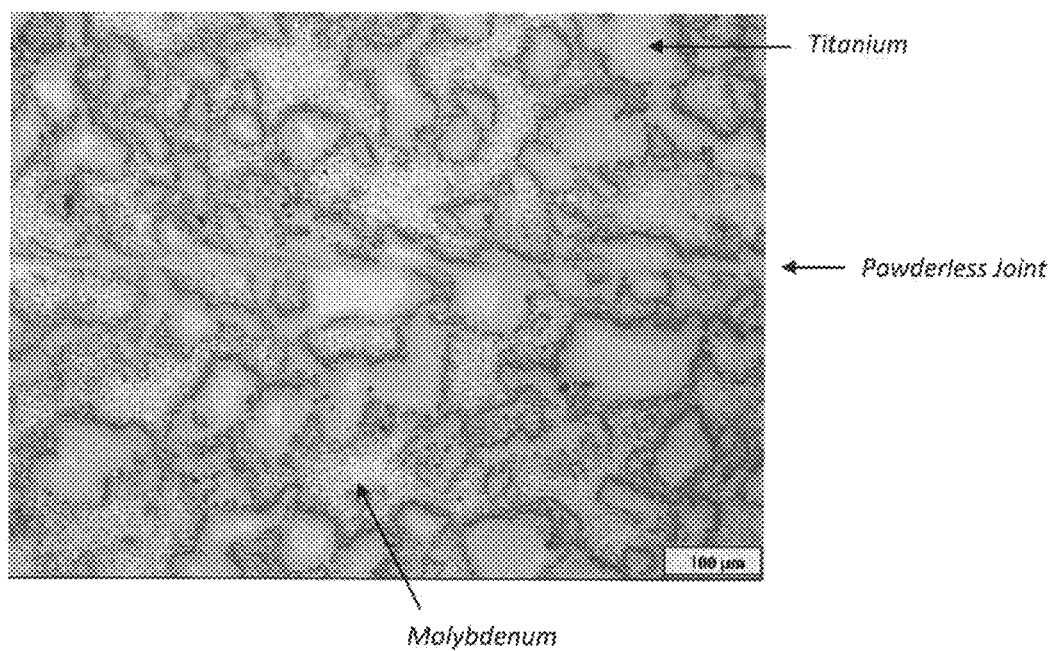

FIG. 3b is an illustrative photomicrograph at 100× depicting a microstructure expected within the present teachings in which no bonding agent is employed between blocks of a target body, and in which surface roughness of blocks prior to joining is higher than the surface roughness in the structure of FIG. 2a.

As can be seen, a target body is made by joining two blocks where the joint between the two original blocks is free of any bonding agent. In this manner, substantially the entirety of material in the target body experiences the same thermo-mechanical processing and is therefore expected to have common microstructural characteristics, such as is depicted. The joints seen in FIGS. 3a and 3b can be characterized (when magnified by at least 25×) by a mere faint interruption in the continuity of the microstructure, but without any significant changes across the joint (which joint is to be expected for other bodies prepared in accordance with the teachings herein, as well). The microstructure on either side of the joint is essentially indistinguishable from the microstructure on the other side. There is an absence of coarsening of grains at the joint. Grains at the joint desirably are of substantially identical morphology as grains within the central portions of the original blocks. In some cases, the effects of preparing the surface for powderless bonding can be seen by an appearance of slight amounts of "smearing" of the material at the joint due to machining, such as with a mill, lathe or grinding tool. Though such smearing is not believed to affect performance, this optionally may be substantially avoided by further machining, by etching, or by some other suitable surface preparation prior to hot isostatic pressing of blocks.

The sample is expected to have a transverse rupture strength per ASTM B528-10 of at least about 400 MPa (e.g., about 480 MPa) at the joint, a Vickers Hardness per ASTM E384-10 of 275-310 (average of indents per sample=5; 10 kg test load) and a density per ASTM B311-08 of about 7.15 to about 7.3 g/cm³. The sample is expected throughout to have a vol % pure Mo phase of about 35 to about 48% (or even about 40 to 45%), a vol % pure Ti phase of about 2 to about 15% (or even about 5 to 10%) and a vol % of alloy phase of about 40 to about 60% (or even about 45 to 55%).

Examples 3-20

Preform blocks are prepared as described in Example 1 except having the compositions below in Tables 1-3. The edges of the blocks are machined to the approximate roughness value (per ASTM B946-06) or $R_A$ as stated below and the resulting blocks are encapsulated in a hot isostatic press container with prepared edges adjoining each other, in the absence of any powder mixture or other material between them. They are hot isostatically pressed at the temperature indicated, under the pressure indicated and for the time indicated in the processing conditions. The latter two columns demonstrate the expected results. Similar results are expected for blocks that are pre-formed by being hot isostatically pressed at about 750° C., for a time of about 4 hours and at a pressure of about 175 MPa, and then heat treated at a temperature of about 750° C. for about 5 hours. The transverse rupture strength below refers to the strength at the joint, and is measured in accordance with ASTM B528-10.

The sample is expected to have a transverse rupture strength (TRS) per ASTM B528-10 of at least about 400 MPa (e.g., about 480 MPa) at the joint, a Vickers Hardness per ASTM E384-10 of 275-310 (average of indents per sample=5; 10 kg test load) and a density per ASTM B311-08 of about 7.15 to about 7.3 g/cm3. The sample is expected to have a vol % pure Mo phase of about 35 to about 48% (or even about 40 to 45%), a vol % pure Ti phase of about 2 to about 15% (or even about 5 to 10%) and a vol % of alloy phase of about 40 to about 60% (or even about 45 to 55%)

TABLE 1

| Ex. | Sample Composition: 40 at % Mo-60 at % Ti (Processing conditions below) | Visible Joint Line Width <100 μm | TRS >690 MPa |
|---|---|---|---|
| 3 | 1080° C./3 hours/150 MPa/3.8 μm $R_A$ | Yes | Yes |
| 4 | 890° C./4 hours/100 MPa/3.8 μm $R_A$ | Yes | Yes |
| 5 | 825° C./6 hours/150 MPa/3.8 μm $R_A$ | Yes | Yes |
| 6 | 1080° C./3 hours/150 MPa/1.6 μm $R_A$ | Yes | Yes |
| 7 | 890° C./4 hours/100 MPa/1.6 μm $R_A$ | Yes | Yes |
| 8 | 825° C./6 hours/150 MPa/1.6 μm $R_A$ | Yes | Yes |

TABLE 2

| Ex. | Sample Composition: 60 at % Mo-40 at % Ti (Processing conditions below) | Visible Joint Line Width <100 μm | TRS >690 MPa |
|---|---|---|---|
| 9 | 1080° C./3 hours/150 MPa/3.2 μm $R_A$ | Yes | Yes |
| 10 | 890° C./4 hours/100 MPa/3.2 μm $R_A$ | Yes | Yes |
| 11 | 825° C./6 hours/150 MPa/3.2 μm $R_A$ | Yes | Yes |
| 12 | 1080° C./3 hours/150 MPa/1.6 μm $R_A$ | Yes | Yes |
| 13 | 890° C./4 hours/100 MPa/1.6 μm $R_A$ | Yes | Yes |
| 14 | 825° C./6 hours/150 MPa/1.6 μm $R_A$ | Yes | Yes |

TABLE 3

| Ex. | Sample Composition: 50 at % Mo-50 at % Ti (Processing conditions below) | Visible Joint Line Width <100 μm | TRS >690 MPa |
|---|---|---|---|
| 15 | 1080° C./3 hours/150 MPa/3.2 μm $R_A$ | Yes | Yes |
| 16 | 890° C./4 hours/100 MPa/3.2 μm $R_A$ | Yes | Yes |
| 17 | 825° C./6 hours/150 MPa/3.2 μm $R_A$ | Yes | Yes |
| 18 | 1080° C./3 hours/150 MPa/1.6 μm $R_A$ | Yes | Yes |
| 19 | 890° C./4 hours/100 MPa/1.6 μm $R_A$ | Yes | Yes |
| 20 | 825° C./6 hours/150 MPa/1.6 μm $R_A$ | Yes | Yes |

GENERAL REMARKS

As to all of the foregoing general teachings, as used herein, unless otherwise stated, the teachings envision that any member of a genus (list) may be excluded from the genus; and/or any member of a Markush grouping may be excluded from the grouping. Percentages of the sputtering target expressed herein refer to the material of the sputtering target available for sputter deposition, and do not include other sputter target components, such as backing plates.

The skilled artisan will appreciate that references to being "visible to the naked eye" is regarded as being from the standpoint of a person with average vision (e.g., about 20/20 vision), unaided by optical magnification.

The skilled artisan will also appreciate that discussion of any microstructure herein contemplates that samples are prepared using conventional metallographic sample preparation techniques for the analysis described. For example, samples may be a mounted section of material that is ground, polished and optionally etched to reveal the microstructure. For analysis of joint lines, the teachings herein envision that the joint lines are viewed in a target body that has been subject only to conventional finishing operations. However, the teachings are also applicable to joint lines viewed in a target body (or section thereof) that has been subject of conventional metallographic sample preparation techniques. Thus, it is possible for the teachings herein that the joint line widths expressed are observed following conventional metallographic sample preparation techniques, in the absence of any metallographic sample preparation techniques, or both. Further, the joint line widths may be measured unaided by microscopy (if possible), with microscopic assistance, or both, and are expected to yield similar results. It will be appreciated that one of the benefits of the present invention is that it may be possible to achieve joint lines that require magnification to detect and/or measure in a finished target. In contrast, with prior techniques that have employed a powder for diffusion bonding a joint, the resulting joint line has been sufficiently large that it is visible to the naked eye (e.g., appearing typically as a band) after conventional finishing operations for the target body.

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 88, 43 to 51, 30 to 32 etc.) are within the teachings of this specification. Likewise, individual intermediate values are also within the present teachings. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of the Invention of a range in terms of at "'x' parts by weight of the resulting polymeric blend composition" also contemplates a teaching of ranges of same recited amount of "x" in percent by weight of the resulting polymeric blend composition.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. Concentrations of ingredients identified in Tables herein may vary ±10%, or even 20% or more and remain within the teachings.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of the elements, ingredients, components or steps. Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, Ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups. It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

What is claimed is:

1. A sputtering target, comprising:
   a) at least two consolidated blocks, each block including an alloy including molybdenum in an amount greater than about 30 percent by weight and at least one additional alloying element; and
   b) a joint between the at least two consolidated blocks, which joins the blocks together to define a target body, the joint being free of any microstructure due to an added bonding agent, and being essentially free of any joint line of greater than about 300 μm width, wherein the sputtering target at the joint exhibits a transverse rupture strength per ASTM B528-10, of at least 800 MPa.

2. The sputtering target of claim 1, wherein the consolidated joint is essentially free of any joint line greater than 200 μm width and provides a structure that has a transverse rupture strength per ASTM B528-10, of at least 900 MPa at the joint.

3. The sputtering target of claim 2, wherein at least one alloying element selected from titanium, chromium, niobium, tantalum, tungsten, zirconium, hafnium, vanadium lithium, sodium, potassium or any combination thereof.

4. The sputtering target of claim 1, wherein the at least two consolidated blocks include a first block and a second block, and the consolidated joint includes a direct contact between a prepared surface of first block with a prepared surface of the second block.

5. The sputtering target of claim 4, wherein the prepared surfaces are milled edges surfaces having an average surface roughness (Ra) of less than about 5.1 μm.

6. The sputtering target of claim 1, wherein each of the consolidated blocks includes about 30 to about 70 at % molybdenum and the balance titanium, exclusive of impurities.

7. The sputtering target of claim 6, wherein an oxygen weight of the sputtering target is between about 1000 ppm and 3500 ppm.

8. The sputtering target of claim 2, wherein the target has a sputtering surface of at least about 1.5 m$^2$, and the two or more consolidated blocks are joined end-to-end.

9. The sputtering target of claim 8, wherein the sputtering target includes about 30 to about 70 at % molybdenum and the balance titanium, exclusive of impurities.

10. The sputtering target of claim 2, wherein the prepared surfaces include edge surfaces that are milled to an average surface roughness (Ra) of less than about 3.8 μm to define opposing prepared surfaces for forming the contacted joint structure.

* * * * *